US 6,199,290 B1

(12) United States Patent
Nguyen

(10) Patent No.: US 6,199,290 B1
(45) Date of Patent: Mar. 13, 2001

(54) METHOD AND APPARATUS FOR AUTOMATIC LOADING AND REGISTRATION OF PCBS

(75) Inventor: Long D. Nguyen, Walnut, CA (US)

(73) Assignee: Excellon Automation Co., Torrance, CA (US)

( * ) Notice: Subject to any disclaimer, the term of this patent is extended or adjusted under 35 U.S.C. 154(b) by 0 days.

(21) Appl. No.: 09/365,288

(22) Filed: Jul. 30, 1999

(51) Int. Cl.⁷ .................................................. G01D 21/00
(52) U.S. Cl. ................................. 33/613; 33/645; 33/638
(58) Field of Search ............................. 33/613, 614, 533, 33/623, 626, 628, 638, 645; 269/305, 303, 903, 312, 314; 414/900

(56) References Cited

U.S. PATENT DOCUMENTS

| Re. 36,608 | * | 3/2000 | Smith et al. ........................ 33/623 |
| 3,492,900 | * | 2/1970 | Hill et al. .............................. 33/614 |
| 4,280,775 | | 7/1981 | Wood . |
| 4,425,076 | * | 1/1984 | Colineau ............................. 269/303 |
| 4,486,128 | | 12/1984 | Baker . |
| 4,520,551 | | 6/1985 | Imhof . |
| 4,538,355 | * | 9/1985 | Morghen ............................. 33/613 |
| 4,593,450 | * | 6/1986 | Dumire ................................ 409/218 |
| 4,596,067 | | 6/1986 | Raiteri . |
| 4,596,500 | | 6/1986 | Raiteri . |
| 4,700,488 | * | 10/1987 | Curti ...................................... 33/613 |
| 4,752,162 | * | 6/1988 | Groh ...................................... 33/638 |
| 4,790,694 | | 12/1988 | Wilent . |
| 4,805,316 | * | 2/1989 | Curti ...................................... 33/613 |
| 4,865,494 | | 9/1989 | Gudow . |
| 4,945,019 | | 7/1990 | Bowen et al. . |
| 5,021,018 | | 6/1991 | Duback . |
| 5,036,574 | | 8/1991 | Kakimoto . |
| 5,054,969 | * | 10/1991 | Gibson et al. ....................... 33/638 |
| 5,068,972 | * | 12/1991 | Herzog et al. ...................... 33/503 |
| 5,087,156 | | 2/1992 | Kanaya . |
| 5,092,715 | | 3/1992 | Theret . |
| 5,094,574 | | 3/1992 | Nishigai . |
| 5,111,406 | | 5/1992 | Zachman . |
| 5,123,789 | | 6/1992 | Ohtani . |
| 5,154,546 | | 10/1992 | Newmann . |
| 5,181,809 | | 1/1993 | Martin . |
| 5,219,379 | * | 6/1993 | Good et al. .......................... 33/645 |
| 5,230,685 | | 7/1993 | Christen . |
| 5,246,316 | | 9/1993 | Smith . |
| 5,255,607 | * | 10/1993 | Nishiyama et al. ................. 33/614 |
| 5,347,462 | | 9/1994 | Okuda et al. . |
| 5,354,153 | | 10/1994 | Ottone et al. . |
| 5,441,474 | | 8/1995 | Morofuji . |
| 5,459,941 | * | 10/1995 | Lowe ..................................... 33/614 |
| 5,479,722 | * | 1/1996 | Smith et al. .......................... 33/623 |
| 5,479,723 | * | 1/1996 | Ternes ................................... 33/614 |
| 5,485,679 | * | 1/1996 | Ternes ................................... 33/623 |
| 5,519,315 | * | 5/1996 | Park et al. ............................ 33/533 |
| 5,529,441 | | 6/1996 | Kosmowski et al. . |
| 5,537,927 | * | 7/1996 | Rogovein et al. ................... 33/614 |
| 5,592,746 | * | 1/1997 | Ternes ................................... 33/623 |
| 5,648,189 | * | 7/1997 | Newman .............................. 33/614 |
| 5,702,213 | | 12/1997 | Polacek et al. . |
| 5,716,310 | | 2/1998 | Polacek et al. . |
| 5,735,646 | | 4/1998 | Finn . |
| 5,769,768 | | 6/1998 | Polacek . |
| 5,774,084 | | 6/1998 | Brombaugh et al. . |

(List continued on next page.)

Primary Examiner—Andrew H. Hirshfeld
Assistant Examiner—Yaritza Guadalupe
(74) Attorney, Agent, or Firm—Henry G. Kohlmann

(57) ABSTRACT

An automatic registration system to be used with a drilling machine that automatic loads PCBs by pushing PCBs from a cart or similar carrier onto the tooling plate for drilling and other operations. The automatic registration system includes at least a tooling plate having an angled slot, a main slot, a registration block, and a pin clamp. The angled slot allows the first registration pin of the PCB to bypass the registration block without requiring the registration block to move out of the way. The pin clamp slides across the angled slot thereby clamping the second registration pin of the PCB against the registration block. The PCB is then registered to the drilling machine and drilling or other operations can take place.

22 Claims, 11 Drawing Sheets

U.S. PATENT DOCUMENTS 5,820,538   10/1998   Watkinson.
5,970,807 * 10/1999   Hsu et al. ............................... 33/645
6,015,249 * 1/2000   Sacchetti .............................. 409/186
6,052,913 * 4/2000   Kaneko et al. ......................... 33/645
6,109,840 * 8/2000   Raiteri .................................. 269/309

* cited by examiner

METHOD AND APPARATUS FOR AUTOMATIC LOADING AND REGISTRATION OF PCBS

BACKGROUND OF THE INVENTION

1. Field of the Invention

The field of this invention relates to registration devices used for positioning work pieces on a work table and holding the same in place while the work piece is operated on. More particularly, this invention relates to registration devices that are attached to the tooling plate of the work tables of numeric controlled machine tools for automatically loading and unloading printed circuit boards and other work pieces for drilling or other machine operations.

2. Description of the Related Art

Printed circuit board (PCB) drilling machines are computer controlled machines having a table that moves in any X, Y plane; and a spindle that moves perpendicular to the table in the Z direction to drill holes in the PCB. On the X, Y table is a mounted plate, commonly called a tooling plate, onto which stacks of one or more PCBs are placed.

PCBs come in a variety of lengths, widths and thicknesses. However, PCBs always have at least two registration pins which are mounted in or through the PCB, so that the pins can be used to precisely mount the board into a known position after the board has been manually or automatically loaded onto the tooling plate. For automatic loading, the tooling plate has at least two types of clamps. A registration pin clamp is used to clamp the PCB's registration pin into a known registration position. The other clamp is a straight edge pin clamp, which is used to clamp the second registration pin into aligmnent with the known registration position at some point spaced apart from the registration position, dependent on the size of the PCB, to prevent rotation of the PCB on the tooling plate.

The registration pin clamping mechanism includes a registration block, which is aligned to the drilling machine for receiving the registration pin into a known registration position, enabling the programmer to use the registration position as a starting datum for creating a drilling program for the PCB. The registration pin clamping mechanism also includes a registration pin clamp which is a moving part that is biased against the registration pin and holds the pin in place against the registration block in the registration position. In order to achieve accuracy, the registration block must be securely mounted to the tooling plate.

The straight edge pin clamp includes a registration bar that is mounted to the tooling plate and aligned to the pin clamp registration block, and a moving edge clamp that clamps and unclamps the anti-rotation PCB pin at some point along the straight edge. Because PCBs come in many different sizes, the straight edge pin clamp must be in the shape of an elongated bar with a straight edge on the side which engages the registration pin so that it can clamp the anti-rotation PCB pin at any distance, regardless of the size of the PCB.

Drilling machines of this type are either automatically or manually loaded and unloaded. Automatic loaded machines come in two different designs. One design loads the PCB by lifting the PCB off of a stack and placing the PCB on top of the tooling plate. The other design slides one or more PCBs on top of the tooling plate into the designated position. In this type of design, the registration block moves out of position in order to enable the PCBs to be loaded into the proper position. Once the PCBs are in the proper position, the registration block will move back into position, and the PCBs will be clamped into place. As a result, maximum accuracy is not always achieved. The movement of the registration block can result in a slight misalignment of the registration block leading to random registration errors. The registration errors are detectable in the sub-micron level precision required for the accurate drilling of PCBs resulting in holes drilled in the wrong locations. Correcting the registration errors is a time consuming process that requires unloading the PCB and adjusting the registration block and registration bar.

For the foregoing reasons, there is a need for a registration system that will eliminate the registration errors introduced by movement of the registration block that are present when a PCB is automatically loaded onto a drilling machine.

SUMMARY

The present invention provides a method and apparatus for automatic loading and registration of work pieces, such as printed circuit boards, and registering against fixed registration points to overcome many of the shortcomings associated with prior art of automatic loading moveable registration systems.

In accordance with one aspect of the present invention, a registration apparatus includes a tooling plate having an angled slot and a main slot, a registration pin clamp, and a fixed position registration block. A PCB having two registration pins is loaded onto the tooling plate such that the first registration pin is clamped against a fixed registration bar and the second registration pin is clamped by a registration apparatus against the fixed position registration block.

According to another aspect of the present invention, a PCB is translated from a cart onto the tooling plate such that the first registration pin enters the angled slot of the tooling plate and moves into the main slot. The second registration pin then enters the angled slot of the tooling plate. When the second registration pin is positioned in the angled slot between the registration pin clamp and the fixed position registration block, translation of the PCB stops. The registration pin clamp then slides across the angled slot, and pushes the registration pin against the fixed position registration block. The second registration pin is now clamped into position against the right-angled end of the registration block. The first registration pin is then clamped into position by a straight edge pin clamp that is mounted along the main slot. The line between the first registration pin and the second registration pin is parallel to the main slot of the tooling plate.

In accordance with yet another aspect of the present invention, a linear motion device, such a pneumatic cylinder, is used to effect movement of the pin clamp towards and away form the angled slot. The linear motion device retracts to push the pin clamp toward and away from the angled slot.

In accordance with a further aspect of the present invention, the angled slot is angled such that the first registration pin passes by the fixed position registration block without requiring movement of the fixed position registration block. In this matter, the first registration pin passes by the fixed registration block and into the main slot of the tooling plate.

In accordance with still a further aspect of the present invention, the registration pin clamp in the fixed position registration block has an angled opening to accommodate any size registration pin. The registration pin clamp pushes the registration pin against the right angled opening of the registration block.

These and other aspects of the present invention are described in full detail in the following description, attached drawings and claims.

BRIEF DESCRIPTION OF THE DRAWINGS

The present invention will be described herein in conjunction with the appended drawing figures, wherein like numerals denote like elements, and.

DETAILED DESCRIPTION

The invention provides a registration alignment system for automatically positioning printed circuit boards (PCB) and other work pieces for drilling or other machine operations. The invention could be used to position a variety of work pieces for drilling or other operations, but the invention is particularly suited for use in positioning PCBs in registration positions for drilling. It should be recognized, however, that this description is not intended as a limitation on the use or applicability of the present invention, but is instead provided merely to enable a full and complete description of a specific embodiment. Other implementations may be recognized by those skilled in the art upon review of this disclosure.

Figure 1:
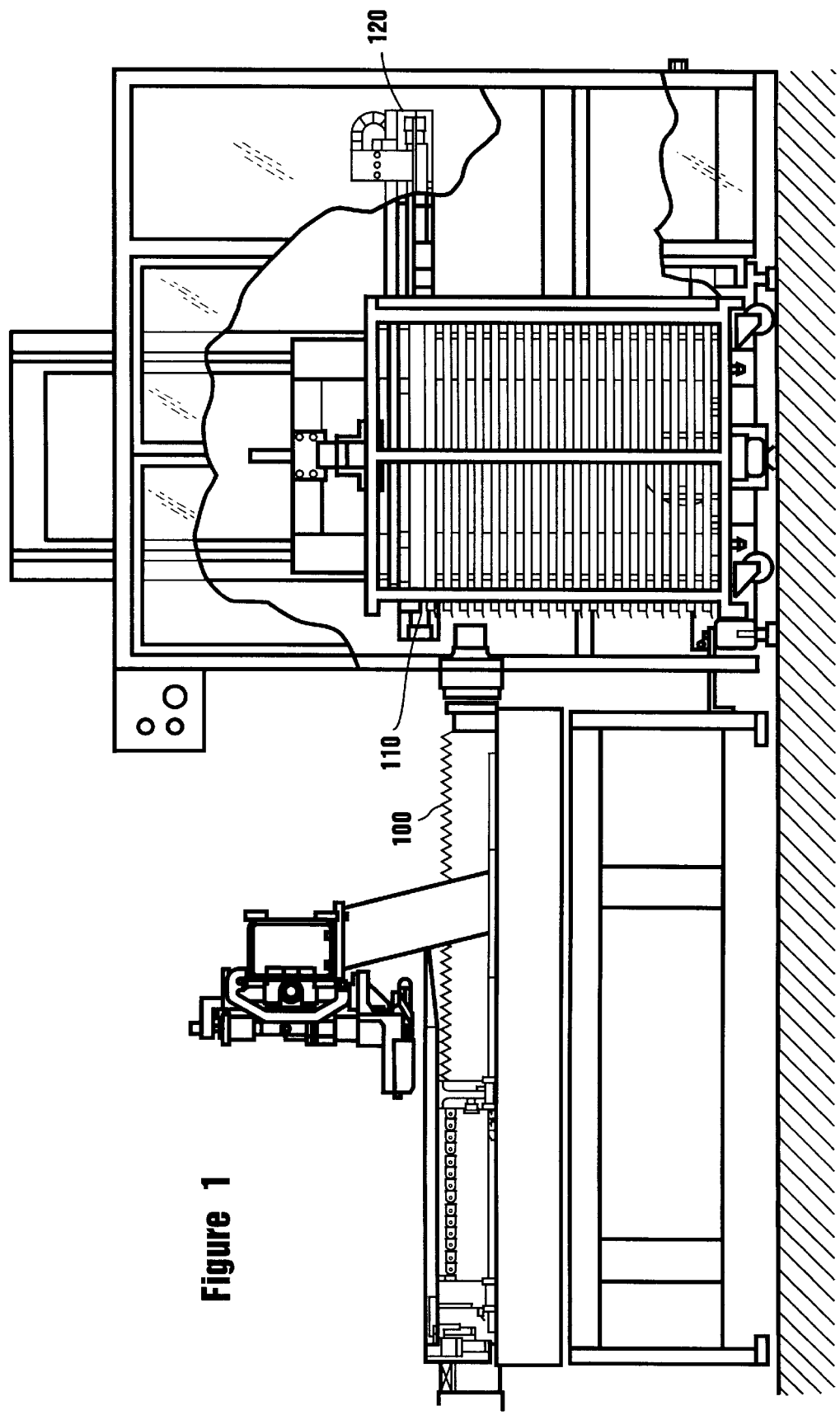
FIG. 1 is an elevation view of an automatic loading and drilling system for PCBs.
Figure 5:
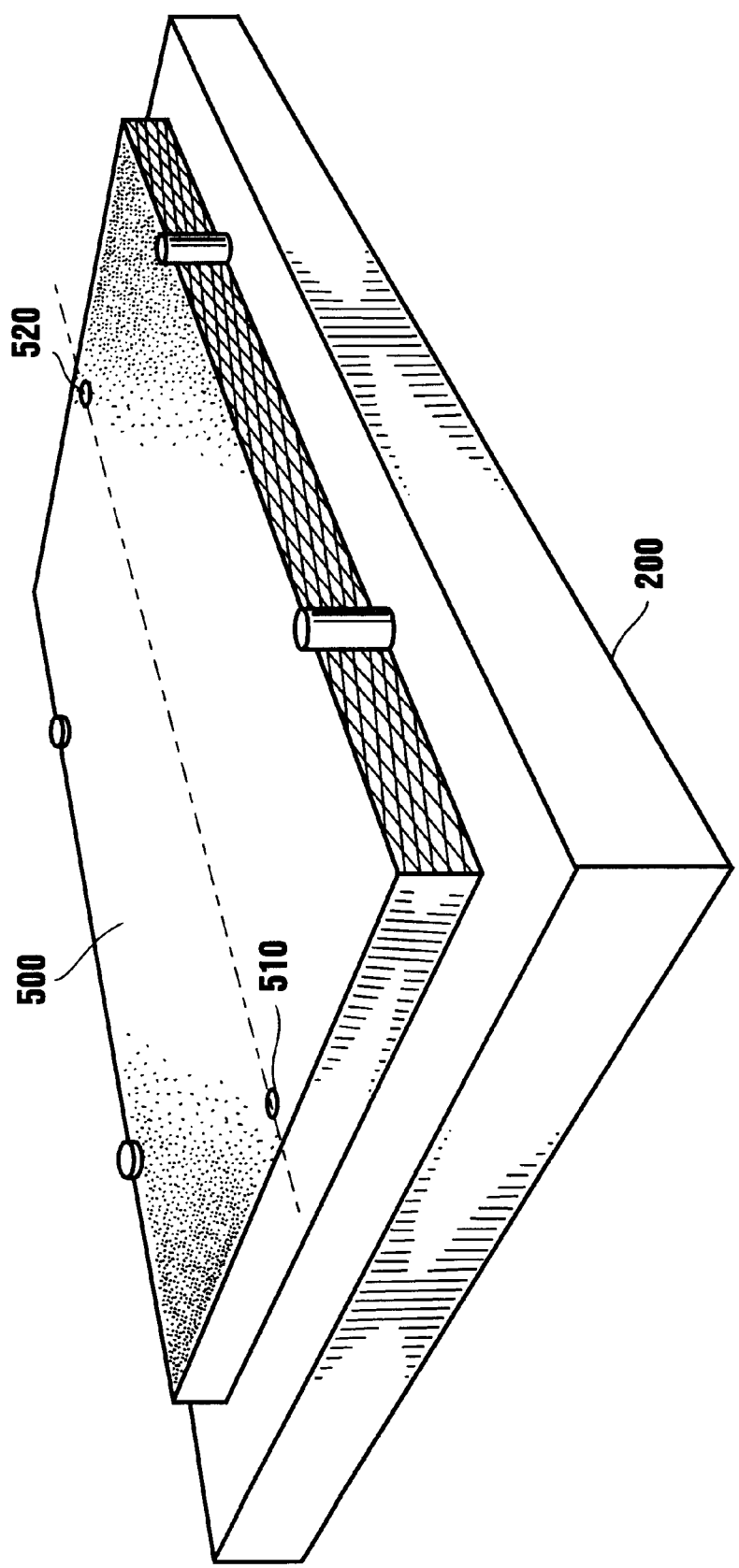
FIG. 5 illustrates a top view of a PCB with two registration pins.

As shown in FIG. 1, an auto-loading PCB drilling system comprises a drilling machine 100, a cart 110 for holding PCBs, and a gripper arm 120 that is operatively coupled to drilling machine 100. Gripper arm 120 loads PCBs from cart 110 onto drilling machine 100 by picking the upper most board from the stack in the cart 110 and translating the same to the drilling machine 100. The drilling machine 100 moves the worktable and the tooling plate into position to receive the PCB. As shown in FIG. 5, drilling machine 100 has a tooling plate 200 for holding a PCB 500 in place for drilling. PCB 500 has a first and second registration pins 510 and 520 that are used to register PCB 500 to drilling machine 100. For clarity the slots for receiving the registration pins are not shown in FIG. 5.

Figure 2:
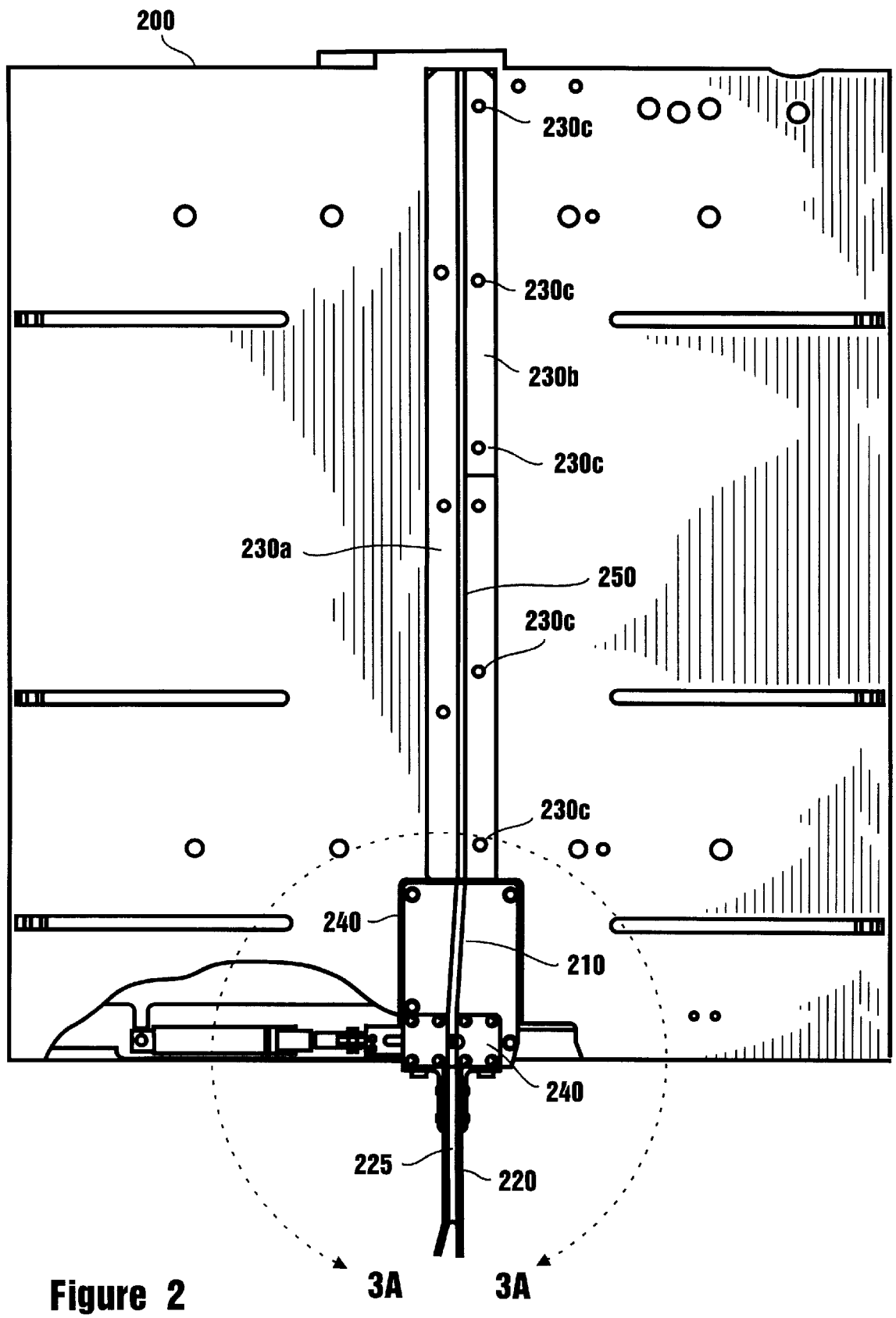
FIG. 2 illustrates a top view of a tooling plate with a registration block apparatus.
Figure 9:
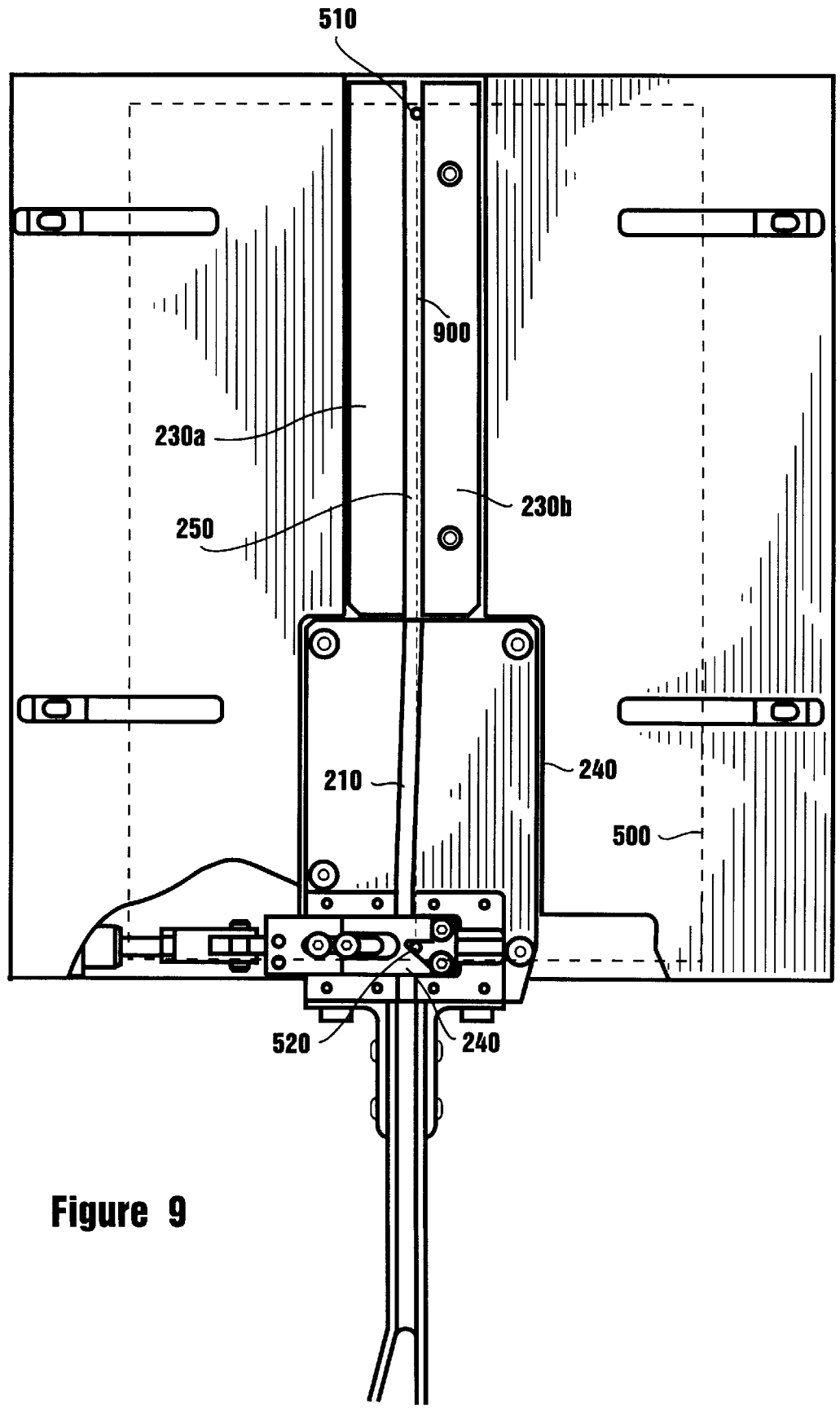
FIG. 9 illustrates a top view of the tooling plate and registration block apparatus of FIG. 2 depicting in phantom lines a PCB loaded and registered.

Referring now to FIG. 2, tooling plate 200 comprises an angled slot 210 for receiving the registration pins and 510 to 520 of PCB 500, a main slot 250, a registration block apparatus 240, and a straight edge pin clamp 230a. A straight edge registration bar 230b holds the registration pin 510 in registration alignment when the registration clamp 230a clamps the registration pin 510 in place against it. A bridge guide 220, having a slot 225, is fixedly corrected to tooling plate 200 so that slot 225 communicates with angled slot 210 of tooling plate 200 and guides registration pins 510 and 520 into slot 210. Angled slot 210 extends through the registration block apparatus 240 and connects bridge guide slot 225 with main slot 250. Bridge guide slot 225, angled slot 210, and main slot 250 receive registration pins along their longitudinal axis as the PCB board is moved into position on the tooling plate 200 anti-rotation pin 510 slides through bridge guide 220, then through angled slot 210 and into main slot 250 such that registration pin 520 is positioned at a registration position in the angled slot. Straight edge pin clamp 230a and registration bar 230b are mounted onto tooling plate spaced apart to form main slot 250. As shown in FIG. 9, when PCB 500 (dotted outline) is loaded onto the tooling plate 200, anti-rotation pin 510 is rigidly held in place against registration bar 230b by moveable straight edge pin clamp 230a, and registration pin 520 is rigidly held in place by registration block apparatus 240 in a registration position. When registration pins 510 and 520 are held into place, the line 900 (depicted by phantom lines in FIG. 9) between the pins is parallel to the registration bar 230b.

Figure 3A:
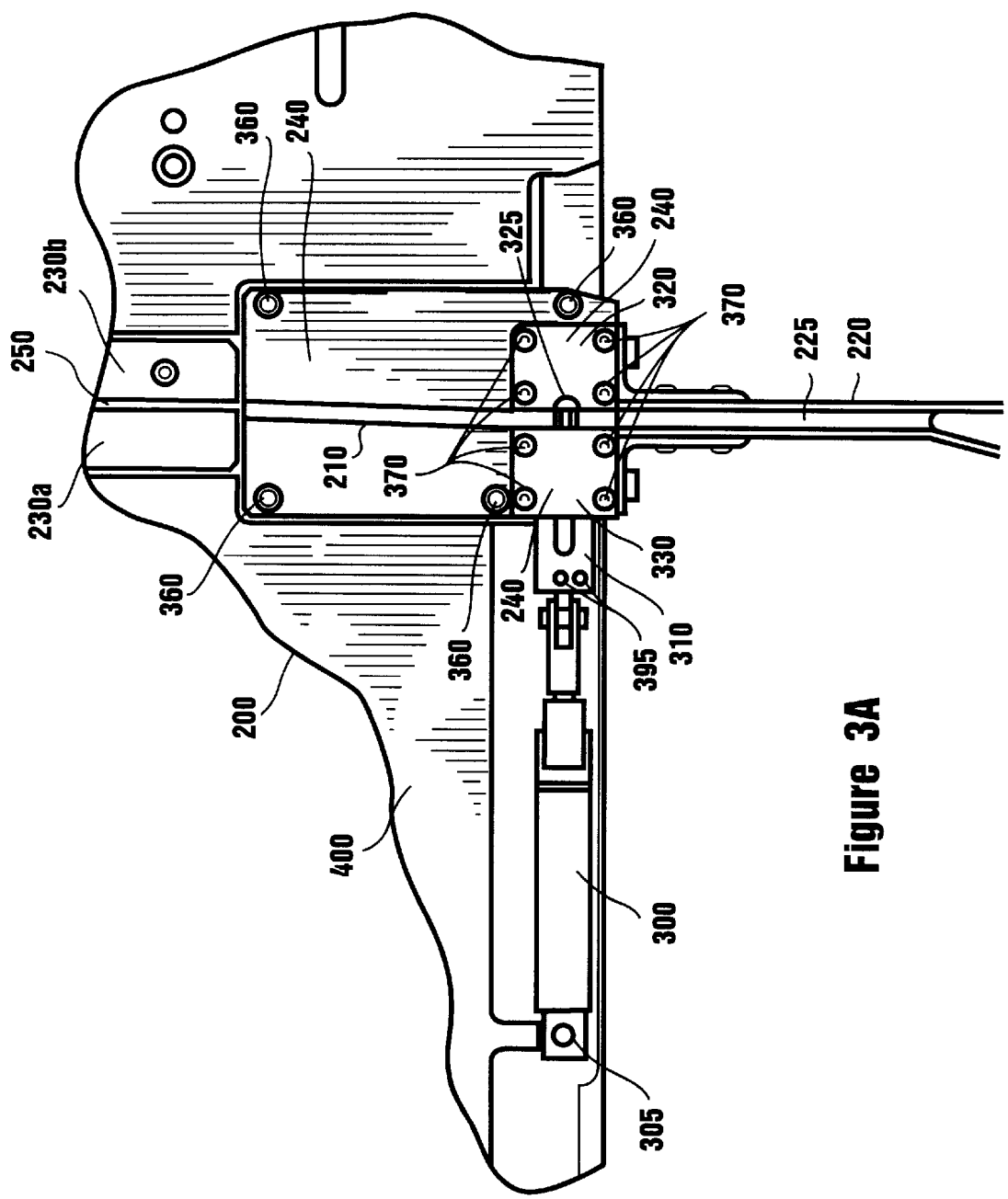
FIG. 3a illustrates a top view of part of the tooling plate with the registration block apparatus of FIG. 2.

FIG. 3a illustrates a top view of registration block apparatus 240 preferably fabricated from steel so as to better withstand wear. Registration block apparatus 240 is mounted to tooling plate 200 and includes stationary and slidable elements. The upper surface 450 of the covers for apparatus 240 are coplanar with the upper surface 400 of tooling plate 200. This co-planar arrangement allows the PCB to lie flat on the tooling plate when it is loaded. The depth of the slots are sufficient to accept the length of the pins 510 and 520 when the PCB lies flat on surface 400. A right cover 320 and a left cover 330 are mounted over registration block 430 in order to protect the assembly below from debris and damage. Covers 320 and 330 are attached to apparatus 240 by a plurality of fasteners 370 known in the art such as screws and the like the upper surface of which must not extend above surface 400. Covers 320 and 330 are easily removed for access to the assembly below. Right cover 320 has a slot 325 which receives the registration pin 520 to permit it to be biased against a registration block (not shown in FIG. 3a) that is to hold registration pin 520 in a registration position.

Figure 3B:
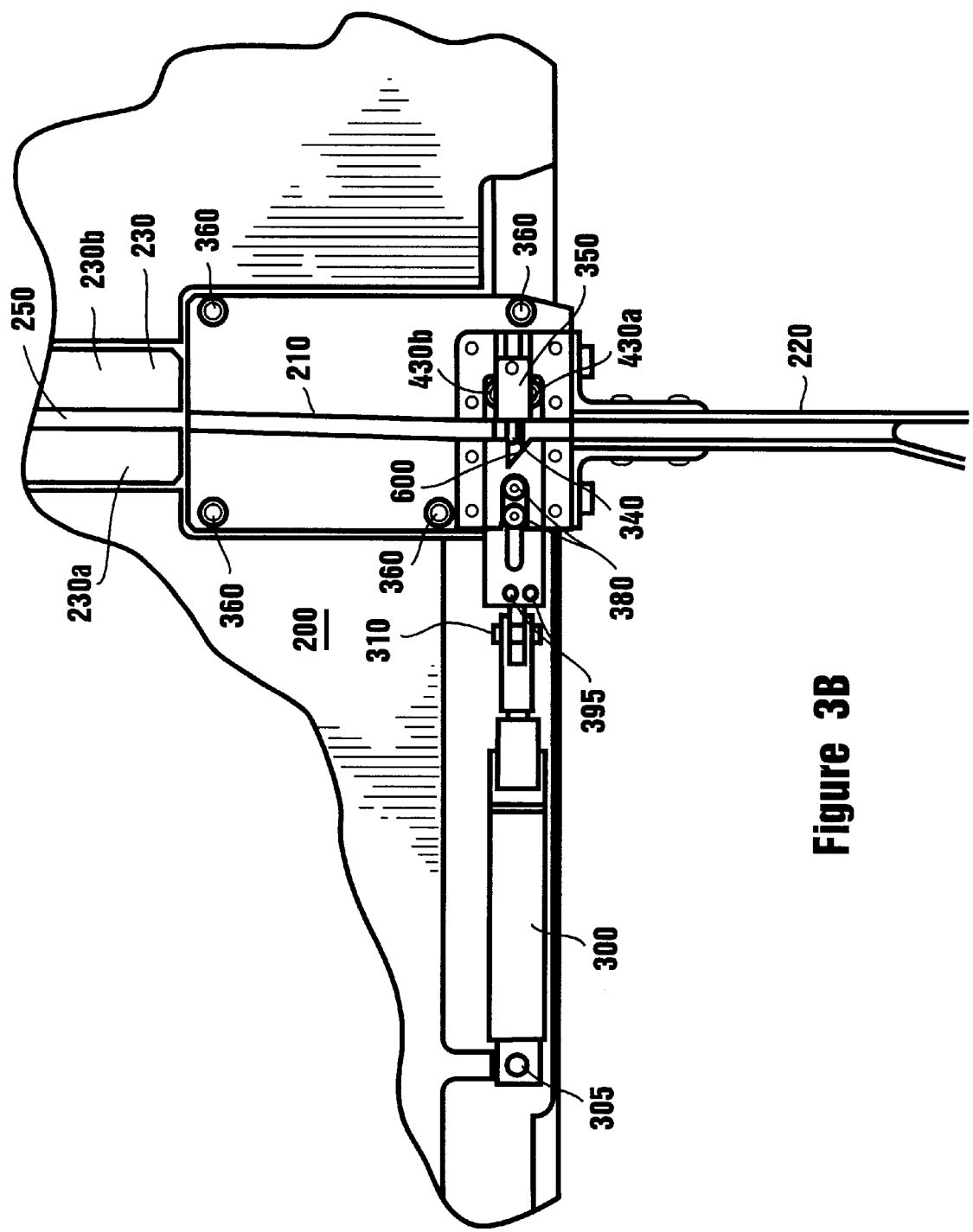
FIG. 3b illustrates a top view of part of the tooling plate with the registration block apparatus of FIG. 2 without the covers.
Figure 4:
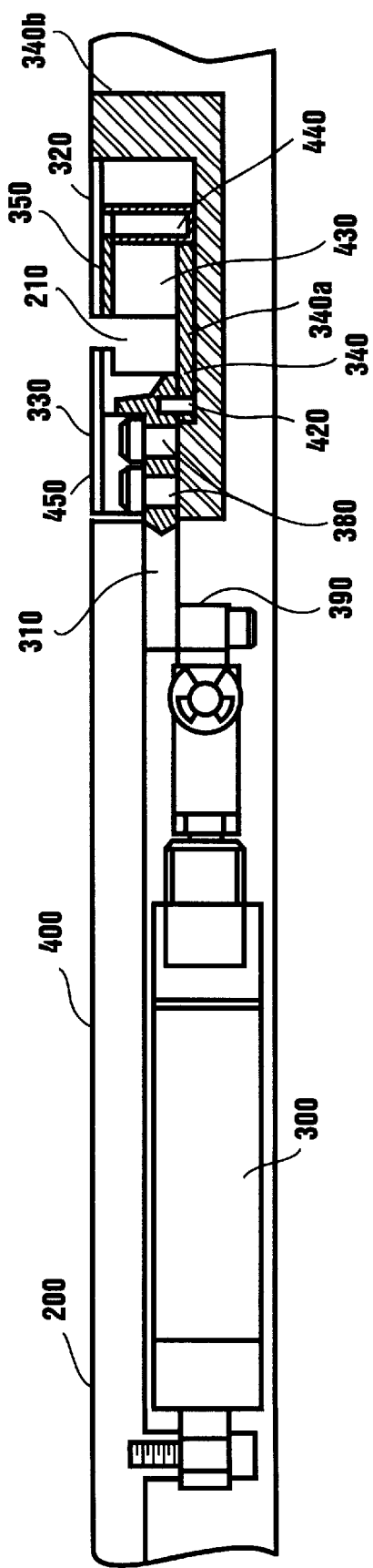
FIG. 4 illustrates a front sectional view of the registration block apparatus of FIG. 2.
Figure 6:
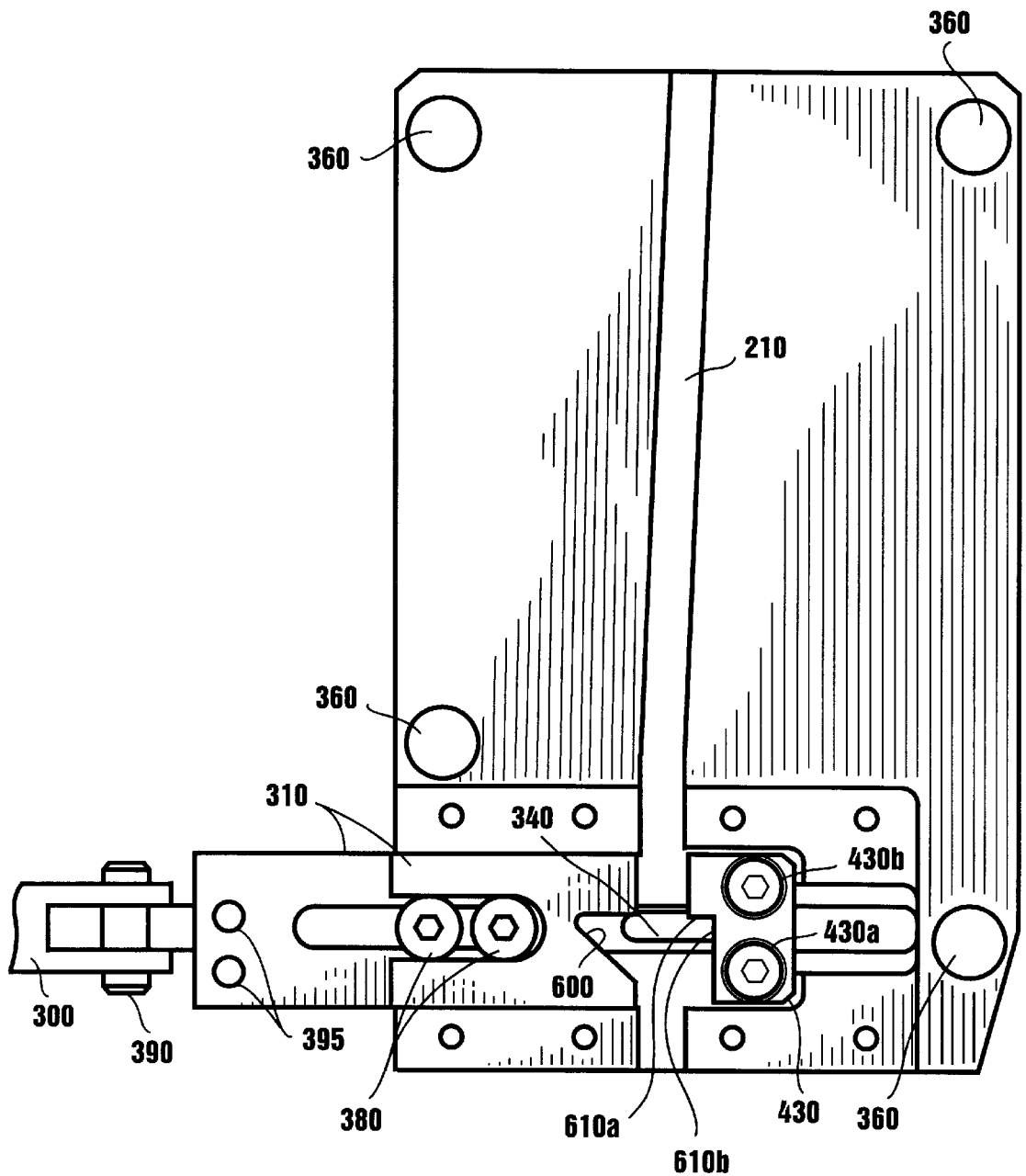
FIG. 6 illustrates a top view of one embodiment of the registration block apparatus of FIG. 2.

FIGS. 3b and 6 illustrate a detailed plan view of the various parts of the registration block apparatus without covers 320 and 330. A slidable registration pin clamp 310 is slidably positioned around one or more guide pins 380, at the initiation of angled slot 210, so that registration pin clamp 310 is moveable across a portion of angled slot 210. It should be noted that the initial portion of the angled slot at the registration position is parallel with the slot of the bridge guide 220. This need not be the case and the slot may be angled along its entire length provided that the registration pin 520 is clamped into the proper registration position by the registration apparatus as shown in FIG. 9. Referring to FIG. 4, an ejector link 340a is slidably received in a recess 340b and is connected to pin clamp 310 by a first dowel pin 420. Ejector link 340a is connected to a pin ejector 350 and mounted above the registration block by a second dowel pin 440. First and second dowel pins 440 and 420 are positioned so that they are slidably moveable toward and away from the longitudinal axis of angled slot 210. A registration block 430 is attached to tooling, plate 200 by fasteners 430a and 430b positioned on either side of link 340a and held rigidly in place. Registration block 430 is calibrated or registered to drilling machine 100 so that the location of registration block 430 is known to a sub-micron precision and fastened in place. Slot 210 is angled to allow the anti-rotation pin 510 to pass by the fixed registration block 430 and into main slot 250. When the anti-rotation pin 510 and the second registration pin 520 are clamped into place, the line between the two pins is parallel to the registration bar 310b and in a position known to the drilling machine (FIG. 9). All positioning is thereafter referenced to the known registration position of pin 520.

Figure 7A:
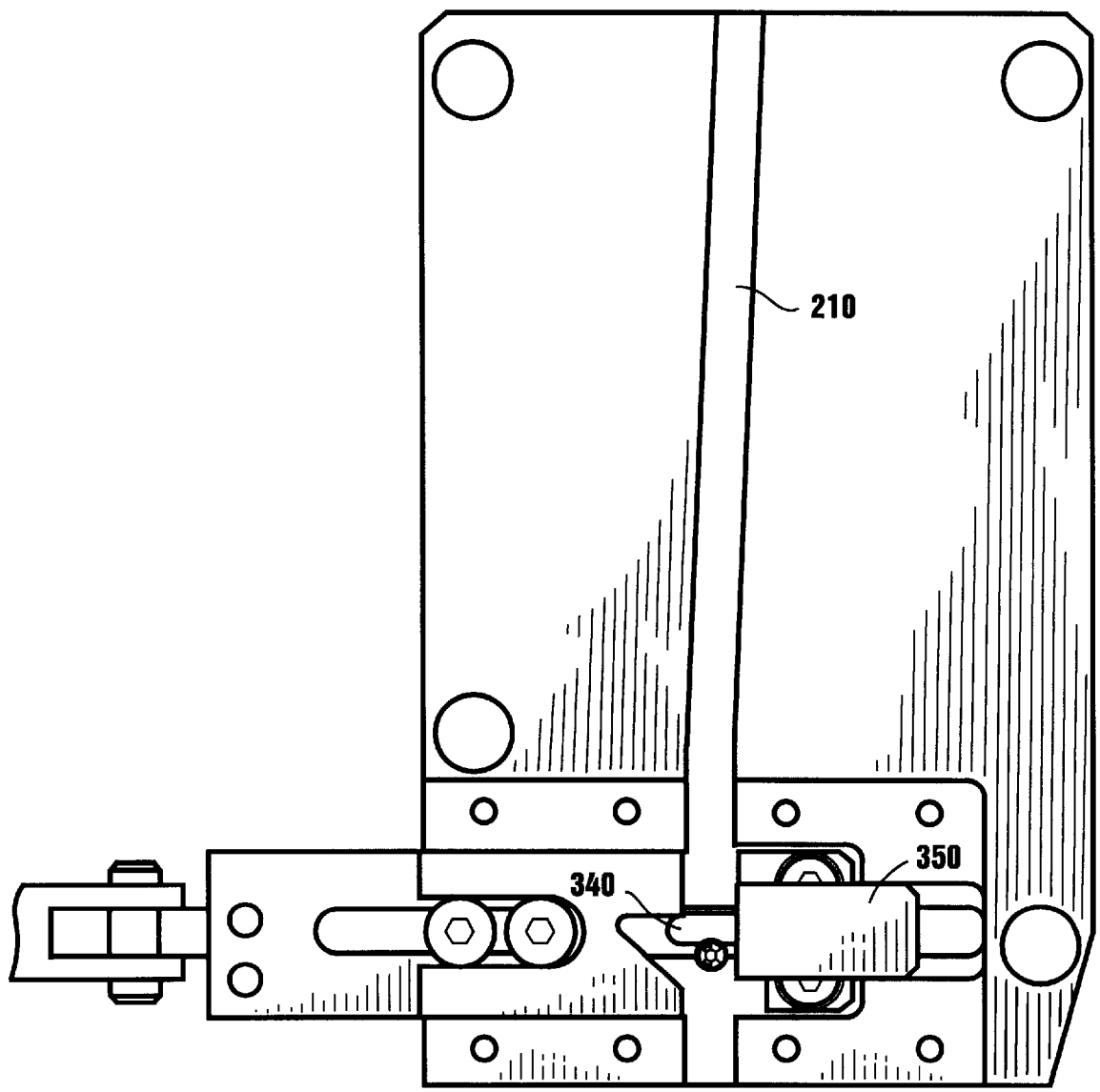
FIG. 7a illustrates a top view of one embodiment of the registration block apparatus of FIG. 2 with an unclamped registration pin.
Figure 7B:
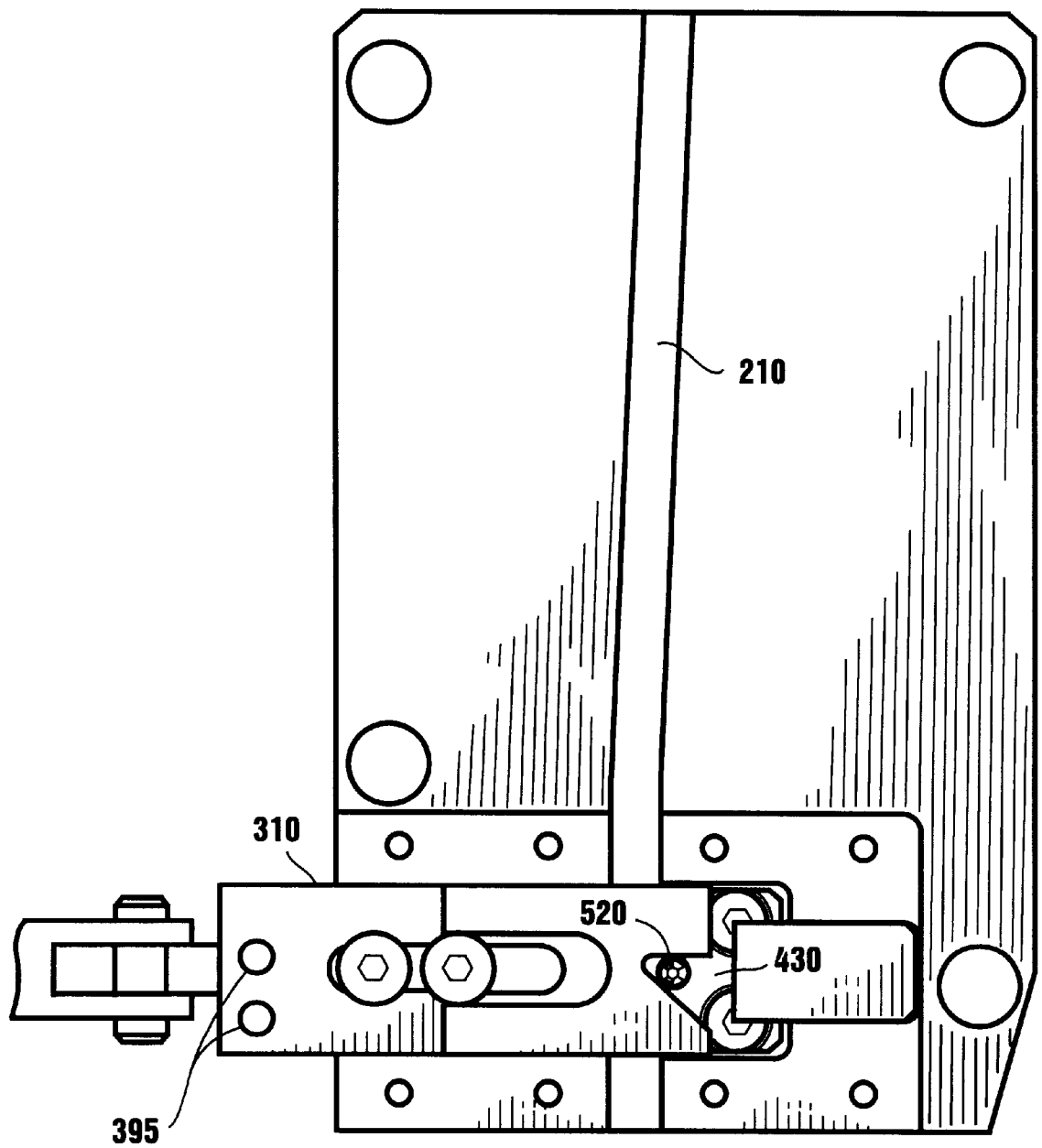
FIG. 7b illustrates a top view of one embodiment of the registration block apparatus of FIG. 2 with a clamped registration pin.

Referring to FIG. 6, registration pin clamp 310 is used to clamp the registration pin 520 in place against the registration block. Pin clamp 310 is generally a rectangular shape when viewed from the top with an opening 600 at one end, that is shaped to bias the registration pin into place against registration block 430 when it engages registration pin 520. Opening 600 is on the end adjacent to angled slot 210 and opening 600 receives registration pin 520. When moved, registration clamp 310 passes over the top of registration block 430 to bias registration pin 520 in place against registration block 430 as illustrated in FIG. 7b. While pin clamp 310 is illustrated with a rectangular shape and a particular shaped opening, it will be appreciated that pin clamp 310 is not limited to this shape and could be formed with any shape that would bias registration pin 520 into a fixed position against registration block 430. The particular shape shown accommodates registration pins of varying diameters, and the structure shown will register one side of the pins used regardless of size against the same registration surface. Thereby allowing proper registration of a variety of work pieces each with different sized pins from other work pieces.

Ejector link 340 connects registration pin clamp 310 to pin ejector 350. Pin clamp 310 is positioned on the side of angled slot 210 opposite registration block 430, and pin ejector 350 is positioned on the same side of angled slot 210 as registration block 430. Ejector link 340 is positioned to be slidably moveable below the registration block while allowing registration pins 510 and 520 to pass above it when the work piece is received by the tooling plate. Ejector link 340a is attached to the bottom of first dowel pin 420 on one side, and to the bottom of second dowel pin 440 on the other side, so that movement of ejector link 340 will also cause dowel pins 420 and 440 to move.

Alternatively, registration pin clamp 310 may be positioned on the same side of angled slot 210 as registration block 430 or in any other position which biases the registration pin 520 against the registration block 430 in a registration position.

Pin ejector 350 is positioned so that it is slidably moveable towards and away from angled slot 210. In order for a registration pin to be biased into a registration position, it must be biased against two surfaces which are at right angles to one another. These are noted in FIG. 7b as edge 610a edge 610b of the registration block. The registration pin clamp 310 must have sufficient clearance when engaging registration pin 520 to bias registration pin 520 into firm contact with each of these edges of the registration block. The upper end of second dowel pin 440 is connected to pin ejector 350 so that the movement of second dowel pin 440 towards and away from angled slot 210 will also cause pin ejector 350 to move towards and away from angled slot 210. Pin ejector 350 engages the registration pin 520 and moves the registration pin away from its registration position against registration block 430 and into angled slot 210.

As shown in FIGS. 3a & 6, a typical pneumatic cylinder 300 is coupled to pin clamp 310 by a cylinder connector 390 and fasteners 395. Cylinder 300 is also attached to tooling plate 200 by fasteners 305 such as bolts or screws. While a pneumatic cylinder has been described, it is contemplated that any equivalent linear motion device or actuator can be used such as an electric solenoid, for example to effect the advancement and retraction of pin clamp 310. Straight edge pin clamp 230a may be similarly actuated.

Registration block 430 preferably has a right-angled opening 610 at one end as illustrated in FIG. 6. Opening 610 is located on the end adjacent to angled slot 210, and opening 600 is used to hold registration pin 520 in place in conjunction with pin clamp 310.

Referring to FIG. 3a, slot 325 of right cover 320 allows the registration pin to be inserted against registration block 430. The right-angled opening of registration block 430 is preferable because it allows registration block 430 to accommodate any size registration pin 520 without requiring calibration of the registration block or the registration bar. The "V-shaped" opening 600 of registration pin clamp 310 is shaped to push registration pin clamp 510 against the right-angled opening 610 of the registration block (surfaces 610 and 610b). While registration block 430 is illustrated with an angled opening, it will be appreciated that registration block 430 is not limited to this shape and could be formed with any shape end that would accommodate registration pin 520 and permit registration pin 520 to be biased into position against two surfaces 610a and 610b.

Referring now to FIG. 2, straight edge registration bar 230b has a fixed or calibrated alignment against which the anti-rotation pin is registered. The registration bar is positioned into a calibrated registration position and fastened into place with fasteners 230c. While registration bar 230b is illustrated as two pieces, a single bar or multiple piece may also be used. Straight edge pin clamp 230a is moveable toward and away from registration bar 230b and is used to clamp the anti-rotation pin 510 into place against registration bar 230b.

The registration block apparatus 240, with its angled slot design, is designed to allow anti-rotation pin 510 to pass by registration block 430 thereby permitting placement of a rigid or fixed registration block. The registration apparatus at the angled slot allows the registration pin 520 to be moved into a position to form a line 900 with anti-rotation pin 510 which is parallel to main slot 250 and disposed in a known registration position, once the pins 510 and 520 are clamped in place.

Figure 8:
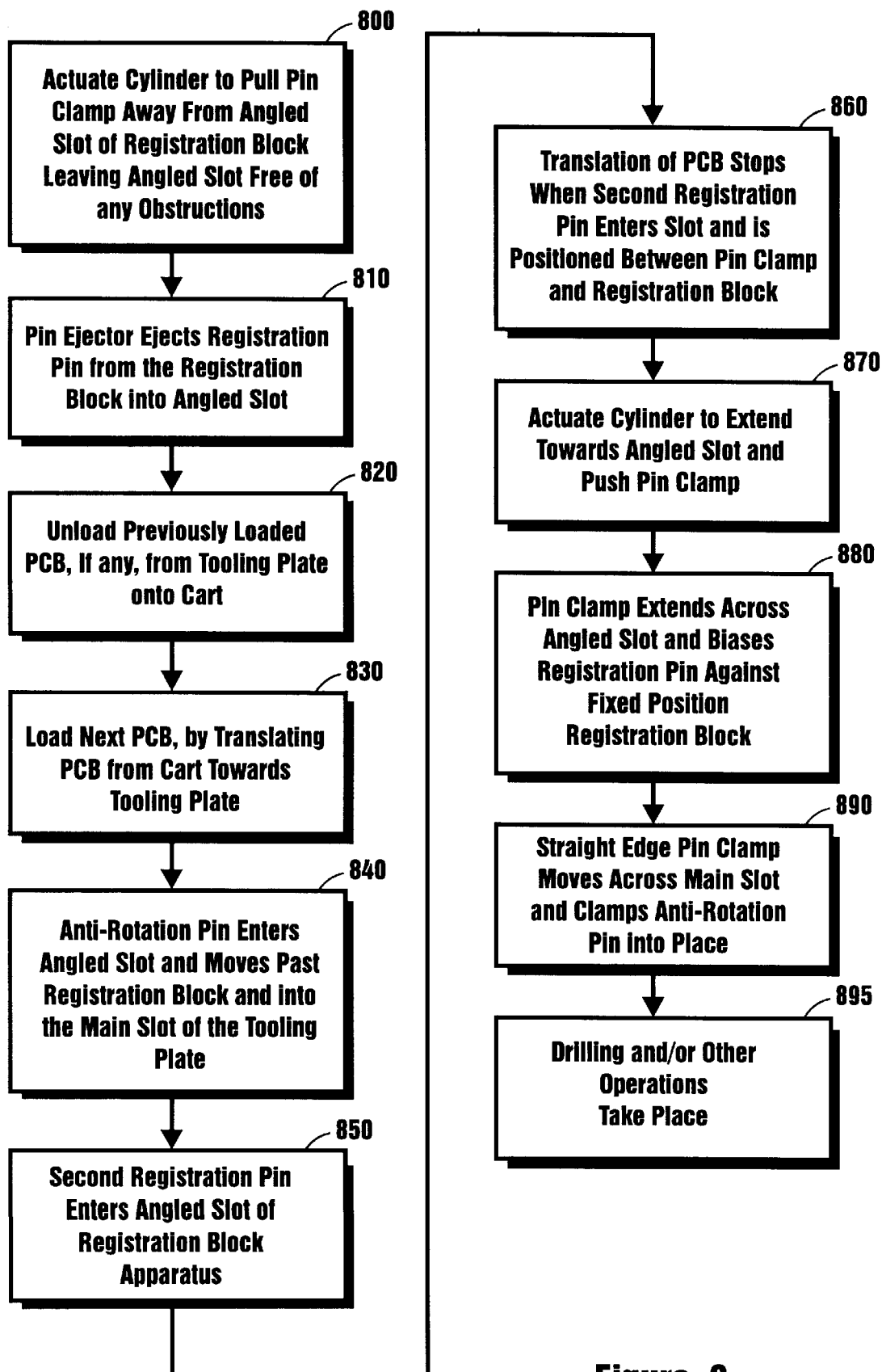
FIG. 8 illustrates a flow diagram according to a process involved in the automatic loading and registration of PCBs using the registration apparatus of FIG. 2.

In operation, the autoload and registration of PCBs is as follows. With reference to FIG. 8, before loading PCBs onto drilling machine 100, pneumatic cylinder 300 is actuated to pull pin clamp 310 away from angled slot 210 of registration block apparatus 240 (step 800), leaving the angled slot and providing clearance for the registration pins of a PCB. As pin clamp 310 moves away from angled slot 210, first dowel 420 pulls ejector connector 340 toward pin clamp 310 causing pin ejector 350 to fill the opening 325 in front of registration block cover 320 of registration block 430 as depicted in FIG. 3b (step 810). This causes the registration pin to be ejected from registration block 430 and into angled slot 210.

Gripper arm 120 unloads previously loaded PCB, if present, translating PCB from tooling plate 200 onto cart 110

(step 820). Next, gripper arm 120 or other appropriate mechanism loads the next PCB by translating the PCB from cart 110 towards drilling machine 100 (step 830), so that anti-rotation pin 510 enters bridge guide 220. As anti-rotation pin 510 moves through angled slot 210, the pin moves past registration block 430, and into main slot 250 (step 840). As anti-rotation pin 510 moves through angled slot 210, and into main slot 250, second registration pin 520 enters bridge guide 220 and moves into angled slot 210 (step 850). Translation of the PCB stops when second registration pin 520 enters angled slot 210 and is positioned between pin clamp 310 and registration block 430 (step 860).

Once second registration pin 520 is between pin clamp 310 and registration block 430, pneumatic cylinder 300 extends towards angled slot 210 thereby pushing pin clamp 310 towards angled slot 210 (step 870). Consequently, pin clamp 310 moves across angled slot 210 pushing second registration pin 520 into position against the right-angled end 610 of registration block 430 (step 880). Pin ejector 350 is pushed away by ejector connector 340 allowing pin clamp 310 to clamp second registration pin 520 into position against registration block 430.

When pin clamp 310 clamps second registration pin 520 into position, straight edge pin clamp 230 clamps anti-rotation pin 510 into place in main slot 250. This is effected by sliding the moveable side of straight edge pin clamp 230 across main slot 250 and clamping the anti-rotation pin against the fixed side of the straight edge pin clamp (step 890). In this manner, the PCB is loaded and registered to drilling machine 100, and drilling or other operations can take place. The line between anti-rotation pin 510 and second registration pin 520 is now parallel to main slot 250.

After completing the drilling or other operations (step 895), the PCB is unloaded from drilling machine 100. Straight edge pin clamp 230 releases anti-rotation pin 510 by moving the moveable side of the straight edge pin clamp away from the anti-rotation pin. Cylinder 300 retracts to pull cylinder connector 390, and consequently, pin clamp 310 away from angled slot 210 (step 800). As pin clamp 310 moves away from angled slot 210, small dowel 420 pulls ejector connector 340 toward pin clamp 310. Pin ejector 350 pushes second registration pin 520 away from registration block 430 and into angled slot 210 (step 810). In this way, second registration pin 520 is released from its position in the fixed position registration block 430. Next, gripper arm 120 unloads the PCB by translating the PCB from tooling plate 200 onto cart 110 (step 820).

The above description is of preferred embodiments of the present invention, and the invention is not limited to the specific embodiments described and illustrated. For example, the registration block may have a "V-shaped" end instead of a "L-shaped" end. In addition, the loading and unloading steps described herein need not be performed in the order described. For example, the pin clamp may release the second registration pin before the first registration pin is released. Furthermore, many variations and modifications will be evident to those skilled in this art, and such variations and modifications are intended to be included within the spirit and scope of the invention, as expressed in the following claims.

What is claimed is:

1. A registration apparatus for use with a machine tool for registering registration pins said apparatus comprising:
   a tooling plate having an angled slot communicating with a main slot;
   a first clamp disposed on one side of said angled slot slidably moveable at an angle to a longitudinal axis of said angled slot for engaging at least one of said registration pins; and
   a registration block mounted in a fixed position adjacent to said angled slot, said first clamp being operable to bias said at least one registration pin into firm contact with said registration block.

2. The registration apparatus of claim 1 further comprising a linear motion device operatively coupled to said first clamp for moving said first clamp into and out of engagement with said at least one registration pin.

3. The registration apparatus of claim 1 further comprising a second pin clamp spaced apart from a registration bar, said second pin clamp and said registration bar forming said main slot.

4. The registration apparatus of claim 1, wherein said registration block has a right-angled end for receiving said at least one registration pin.

5. The registration apparatus of claim 4 wherein said first clamp has an angled opening for engaging said at least one registration pin and biasing said at least one registration pin into a registration position against surfaces forming said right-angled end of said registration block.

6. A system for automatic loading and registering work pieces having registration pins, said system to operate with a machine tool and comprising
   a tooling plate having an angled slot and a main slot communicating with said angled slot;
   a gripper arm for loading the work pieces onto said tooling plate;
   a moveable pin clamp mounted to said tooling plate and disposed for selective movement across said angled slot;
   a registration block mounted in a fixed position spaced apart from said moveable pin clamp; and
   a linear motion device operatively coupled to said moveable pin clamp for moving said moveable pin clamp to engage at least one of said registration pins and selectively biasing said at least one registration pin against said registration block.

7. The registration apparatus of claim 6 wherein said linear motion device is operatively coupled to said moveable pin clamp for moving said moveable pin clamp into and out of engagement with said at least one registration pin.

8. The registration apparatus of claim 6 further comprising a registration bar and a straight edge pin clamp spaced apart from said registration bar, said straight edge pin clamp and said registration bar being positioned on opposite sides of said main slot.

9. The registration apparatus of claim 6 wherein said moveable pin clamp has an angled opening for engaging said at least one registration pin and biasing said at least one registration pin into a registration position against a first surface and a second surface forming said registration block.

10. The registration apparatus of claim 9, wherein said first and second surfaces of said registration block form a right-angled end for receiving said at least one registration pin.

11. A method of automatically loading a work piece having a plurality of registration pins onto a tooling plate of a machine tool, said tooling plate having a first registration pin clamp and a registration block, said method comprising the steps of:
   moving the work piece to the tooling plate;
   guiding a first registration pin of said plurality of said registration pins the work piece board into an angled slot in the tooling plate;

moving the work piece relative to the tooling plate to position said first registration pin into a main slot which communicates with said angled slot and to position a second registration pin of said plurality of registration pins into said angled slot;

stopping the moving of said work piece when said second registration pin is adjacent to said at least one registration pin clamp.

moving said at least one pin clamp so that said pin clamp biases said second registration pin against said registration block; and clamping said first registration pin into a fixed position in said main slot.

12. The method of claim 11, wherein said registration block is stationary relative to the tooling plate.

13. The method of claim 11, wherein said moving said first pin clamp step is effected by a linear motion device operatively coupled to said pin clamp.

14. A registration alignment apparatus for a machine tool comprising:

a. a tooling plate having a first slot for with at least one side of said slot forming a an elongated registration surface, said first slot receiving a first registration pin;

b. a second slot disposed at an angle to the elongated registration surface communicating with said first slot, said second slot receiving a second registration pin;

c. a registration block mounted in a fixed position relative to said tooling plate;

d. a second registration pin clamp for selectively engaging said second registration pin and biasing said second registration pin against said registration block; and e. a first registration pin clamp for selectively engaging said first registration pin and biasing said first registration pin against said elongated registration surface.

15. The registration apparatus of claim 14 wherein said registration block has a surface which is parallel to said elongated registration surface.

16. The registration apparatus of claim 14 wherein said first registration pin clamp is an elongated bar moveably disposed with respect to said elongated registration surface.

17. The registration apparatus of claim 14, wherein said registration block has a first edge and a second edge which form a right-angle.

18. The registration apparatus of claim 17 wherein said second pin clamp has an angled edge for engaging the second registration pin and biasing said second registration pin against said first and second edges of said registration block.

19. A system for automatic loading and registering a board having a first registration pin and a second registration pin into a working position on a machine tool, said system comprising:

a. a tooling plate having an angled slot and a main slot for receiving said first and second pins;

b. a loading arm for loading the board from a storage location onto said tooling plate;

c. at least one pin clamp mounted on one side of said angled slot for engaging said second pin;

d. at least one registration block mounted in a fixed position relative to a work table of said machine tool; and e. means for moving said at least one pin clamp into a biasing position against said second registration pin wherein said second registration pin is biased against said registration block.

20. A system as described in claim 19, further comprising a second pin clamp which engages said first registration pin.

21. A method of automatically loading a work piece having a plurality of registration pins onto a tooling plate of a machine comprising:

a. translating the work piece from a storage position to the tooling plate;

b. guiding a first registration pin of said plurality of registration pins and a second registration pin of said plurality of registration pins of the work piece into an angled slot on the tooling plate;

c. moving said first registration pin past a registration block and into a main slot in the tooling plate which communicates with said angled slot;

d. stopping the work piece when said second registration pin enters a registration location between a registration block pin clamp and said registration block;

e. moving said registration block pin clamp so that said registration block pin clamp pushes said second registration pin against said registration block; and f. moving a registration pin clamping bar so that said registration pin clamping bar pushes said first registration pin against an edge of said main slot of said tooling plate.

22. The method of claim 21, wherein said registration block is disposed in a fixed position relative to the tooling plate.

* * * * *